(12) United States Patent
Pappu et al.

(10) Patent No.: US 10,725,097 B2
(45) Date of Patent: Jul. 28, 2020

(54) PLATFORM COMPONENT INTERCONNECT TESTING

(71) Applicant: Intel Corporation, Santa Clara, CA (US)

(72) Inventors: Lakshminarayana Pappu, Folsom, CA (US); James J. Grealish, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 708 days.

(21) Appl. No.: 15/385,500

(22) Filed: Dec. 20, 2016

(65) Prior Publication Data
US 2018/0172759 A1 Jun. 21, 2018

(51) Int. Cl.
*G01R 31/28* (2006.01)
*H03K 5/24* (2006.01)
*G11C 29/02* (2006.01)
*G01R 31/317* (2006.01)

(52) U.S. Cl.
CPC ... *G01R 31/2853* (2013.01); *G01R 31/31715* (2013.01); *G11C 29/022* (2013.01); *G11C 29/025* (2013.01); *G11C 29/028* (2013.01); *H03K 5/24* (2013.01)

(58) Field of Classification Search
CPC ............... G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 2014/0070791 A1* | 3/2014 | Funakoshi | G01R 19/0084 324/76.11 |
| 2016/0033584 A1* | 2/2016 | Kolanko | H05B 47/23 324/511 |
| 2016/0282407 A1* | 9/2016 | Bacigalupo | G01R 31/2621 |

\* cited by examiner

*Primary Examiner* — Tung X Nguyen
(74) *Attorney, Agent, or Firm* — Womble Bond Dickinson (US) LLP

(57) ABSTRACT

A method and apparatus for platform component interconnect testing is disclosed. In one embodiment, an integrated circuit comprises: a plurality of interface circuitries, wherein each interface circuitry comprises a driver with adjustable pullup and pulldown resistances and having a driver output to output a driver voltage to a pad during test mode, and a comparator having a first input coupled to the driver output and a second input coupled to a voltage reference, the comparator being operable to generate a comparator output in response to comparing the driver voltage with the voltage reference; and analysis circuitry coupled to receive the comparator output, the analysis circuitry operable, during the test mode, to detect existence of a fault associated with a signal path coupled to the pad for each interface circuitry.

20 Claims, 6 Drawing Sheets

PLATFORM COMPONENT INTERCONNECT TESTING

FIELD OF THE INVENTION

Embodiment relate to the field of computer systems; more particularly, embodiments relate to platform component testing.

BACKGROUND OF THE INVENTION

With a growing number of platform level components, reliable board level interconnect testing has become a problem for system manufacturers. OEMs (Original Equipment Manufacturers) have been complaining about the current deficiencies in board level testing and how the companies aren't meeting the needs of the industry. There are reported instances where OEMS threatened component manufacturers to comply with their demand or risk losing their business.

There are several reasons that arcane platform board level testing techniques are untenable going forward for companies. For example, there is a classic problem of checking the electrical integrity of a board without the need for a complete system reset while needing the system to come out of reset to be able to test electrical soundness of a board. However, the board may not come out of reset due to defects introduced in the assembly process. Thus, reset can't be completed, and there is currently an enormous design convergence effort, and time-to-market pressure is preventing companies from making the board testing independent of a full system reset.

Due to the cost reasons (including the additional 4 TAP pins), DRAM logic doesn't incorporate typical board testing logic. OEMs send functional traffic at low speeds, using the board testing apparatus from the CPU. For example, many platform boards include Double Data Rate synchronous dynamic random-access memory (DDR SDRAM) and a DDR board connectivity check involves sending and receiving low speed (<1 MHZ) data via read and write operations between a System-on-Chip (SoC) and the DDR memory. Industry could get away due to relatively lower DDR speeds, but this method is not scalable. DDR can constitute greater than 30% of the overall nets on a typical notebook board. With the increasing DDR speeds and various vendor proprietary logic implementations, some of the DRAMS aren't reliably responding to this traditional way of testing from central processing units (CPUs) at such low speeds. This is creating a test hole and jeopardizing the quality of the platform boards. Thus, DDR training often doesn't occur, preventing one from testing the logic in a functional manner.

Also, there are a number of different types of DRAM that have utilized in the platform and these may each have a protocol associated with them. For example, a particular DRAM may use DDR3 protocol while another uses the DDR4 protocol. The current techniques are not suitable for all these different variants and protocols, which makes performing platform testing difficult.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

The techniques described herein relate to testing platform connectivity from a processor to an external memory component on a board. The testing determines whether the board connectivity (e.g., the interconnect) is reliable and can operate under a number of different circuit operating conditions. In one embodiment, the techniques described above are scalable in that irrespective of the number of components a chip manufacturer adds to a SoC, the amount of design effort remains minimal. In one embodiment, instead of relying on sending functional data from central processing unit (CPU) to the dynamic random access memory (DRAM) and checking to see if the DRAM read it correctly, the platform testing is static in that its protocol independent (e.g., independent of protocol speed (e.g., double data rate (DDR) speed)). In one embodiment, the testing is able to test irregularities in DDR technologies protocols that vary from DDR generation to generation to test the connection between the CPU and the DRAM. In doing so, the techniques described herein electrically test each board connection (e.g., signal path, wire, conductor, etc.) connecting the CPU to the DRAM while relying on the use of electrical connectivity concepts that are generation independent and are guaranteed to work for any OEM using the components from any DRAM vendor.

Figure 1:
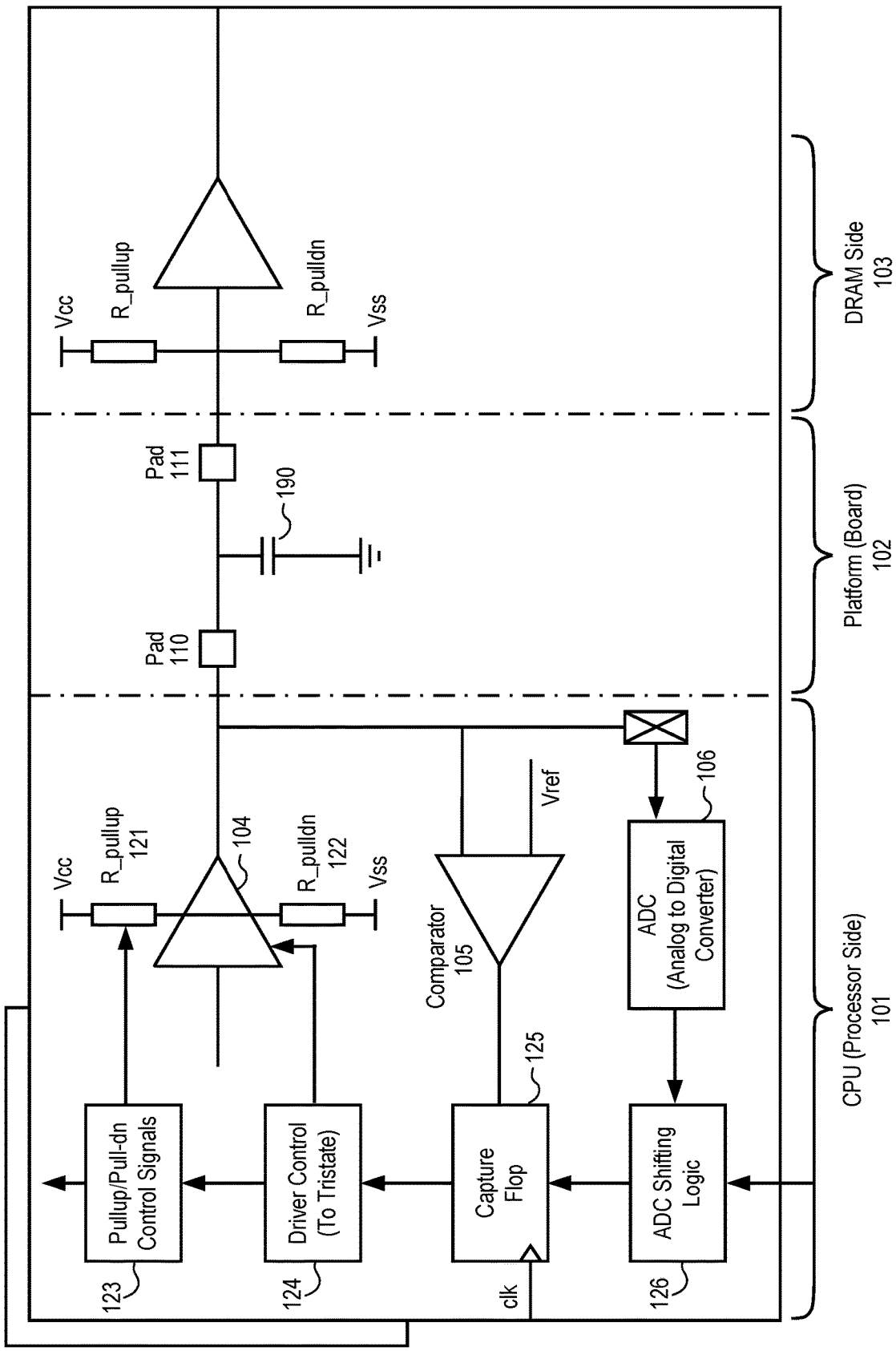
FIG. 1 is a block diagram illustrating an infrastructure to test and debug a board connection.

FIG. 1 is a block diagram illustrating an infrastructure to test a board signal paths between CPU (SoC) and external components including DRAM memory. In one embodiment, each signal path comprises a wire, conductor, or other type of connection. The infrastructure represents a departure from read/write concept of CPU to DRAM testing. In one embodiment, DRAM platform board signal paths are tested for opens, shorts, and cross path violations through low speed structural techniques. In one embodiment, these testing and debug speeds could be up to 20-100 MHZ.

Referring to FIG. 1, a central processing unit (CPU) cell, or interface circuitry block, 101 is interconnected with a DRAM 103 via a platform (board) 102. CPU cell 101 may be part of a processor, controller, system-on-chip (SoC), etc. In one embodiment, there is a CPU cell for each pad. In one embodiment, the DRAM may have 200-300 pad structures. Therefore, in one embodiment, there is a corresponding number of CPU cells coupled to the platform.

Platform 102 shows two pads, pads 110 and 111, that are interconnected by a board signal paths and driven by a driver 104 in CPU cell 101. Pad 110 is connected to driver 104, while pad 111 is connected to an input of DRAM 103. A capacitor 190 is shown coupled to the board signal path between pads 110 and 111. Capacitor 190 is a logical representation of the capacitance of the board signal path.

CPU cell 101 is responsible for driving the data on the pad to the DRAM. The term "cell" or "block" refers to an individual interface tile or component that is used to testing one board wire during board testing. Note that such an interface may be used for communication between the integrated circuit and the memory during normal (e.g., non-test mode) operation. In particular, CPU cell 101 includes a driver 104 connected to pad 110 to drive a voltage onto the wire between pads 110 and 111 and onto the DRAM.

In one embodiment, CPU cell 101 includes several controls used by the CPU side of the logic to test the overall board integrity. In one embodiment, CPU cell 101 includes a programmable pull up resistor and a programmable pull down resistor used to control the output voltage that is driven by driver 104. Programmable pull up resistor, R_pullup 121, and a programmable pull down resistor, R_pulldn 122, enable driver 104 to adjust the resistance and set the voltage levels on pad 110 in platform 102 to a desired level. In one embodiment, this voltage level is either a digital one or a digital zero and the voltage is set by changing the pull up and pull down register values. In one embodiment, the voltage set is that voltage that would normally be used when operating the platform and exchanging data between the CPU and the DRAM. However, it should be noted that, any voltage could be placed onto the pad by the driver based on the setting of register values.

Figure 2:
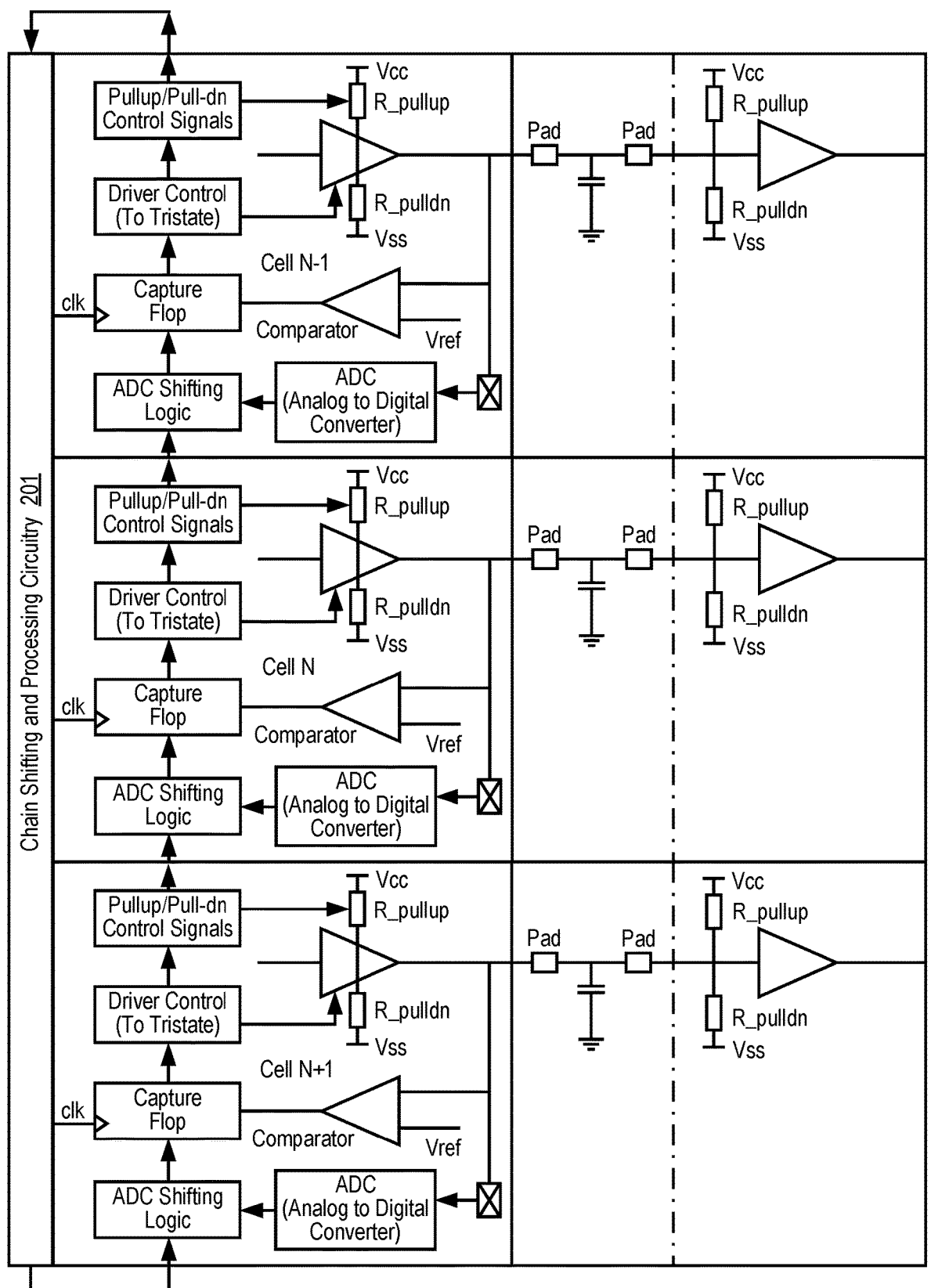
FIG. 2 is a block diagram of a plurality of interfaces forming a test chain for use in performing platform testing.

By setting register values in a memory as a part of the control of driver 104, the resistors 121 and 122 are set so that a particular voltage is driven onto the pad by driver 104. Based on the programmed register values, pull_up/pull_dn controller 123 generates control signals to control resistors R_pullup 121 and R_pulldn 122. In one embodiment, controller 123 is part of a shift chain logic and these values are shifted through the chain to controller 123 as shown in FIG. 2, which is described in more detail below. In one embodiment, to achieve a certain voltage level on the interconnecting path, one needs to adjust R_pullup/R_pulldn resistances on both CPU side and DRAM side. Therefore, R_pullup/R_pulldn resistances are included in DRAM side 103.

CPU cell 101 also includes driver control 124 that is coupled to control driver 104. In one embodiment, driver control 124 is able to tristate the driver or enable the driver based on one or more control signals.

Also, CPU cell 101 includes a comparator 105 to compare the line voltage level driven to pad 110 by driver 104 with a voltage reference (Vref). In one embodiment, Vref is selected so that a determination can be made as to whether the voltage being driven by driver 104 is a one or a zero. Therefore, in one embodiment, the Vref is adjusted to a value depending on the value that is going to be detected. If the value being driven by driver 104 onto pad 110 is less than Vref, it is considered a zero; if the value driven by driver 104 onto pad 110 is greater than Vref, it is considered a one.

A capture flop 125 captures the output of comparator 105 that indicates the results of the comparison. In one embodiment, the comparator output is eventually shifted out and compared against the expected values by the test programs.

An analog-to-digital (ADC) 106 measures the line voltage level as well and allows for calibrating comparator 106. In one embodiment, calibration of comparator 106 is performed in the following way:

Step 1: Choose R_pullup/R_pulldn resistances to output a certain known voltage value (e.g., 0.63V) on the output of the buffer.

Step 2: Select resistor values to adjust a Vref value. In one embodiment, Vref is a resistor network connected to a known good power supply. By selecting the number of active resistors in a network, one could set the Vref value.

Step 3: Check whether the comparator output (e.g., logic zero or logic one). For example, to identify voltage range of 0.0 to 0.49V as logic "zero" and 0.51 to 0.95V as logic "high", then adjust Vref to be 0.5V so that the voltage value on the line could be classified as logic 0/logic 1.

Step 4: The ADC converts the analog voltage to the digital value. By taking several iterations of step 1, step 3, and step 4, one can determine whether the comparator is behaving as intended, i.e. correctly classifying the signal as logic zero and logic one.

In one embodiment, ADC 106 receives the voltage driven by driver 104 onto pad 110 and generates a digital value. ADC 106 outputs the digital value to ADC shifting logic 126, which captures value. The captured value from ADC 106 undergoes analysis to verify that the voltage that driver 104 has been set up to drive onto pad 110, via programming R_pullup resistor 121 and R_pulldn resistor 122, is actually being produced by driver 104. Thus, ADC 106 and ADC shifting logic 126 are used for captured value debug. In one embodiment, ADC shifting logic 126 comprises circuitry and capture registers to capture the ADC values from ADC 106 and shift the captured data as part of the shift chain.

CPU cell 101 is one of a plurality of cells that are coupled together to perform board testing. FIG. 2 illustrates one embodiment of a plurality of cells of FIG. 1 coupled to a platform to perform board testing. Referring to FIG. 2, CPU cells N−1, N and N+1 are shown coupled with each other in a serial shift chain that is coupled to chain shifting and processing circuitry 201. While only three CPU cells are shown, it should be noted that there are typically many more such cells, particularly where the interconnect includes a large number of board signal paths. For example, a platform with a DDR interface may include over 300 such board signal paths. In such a case, there would be over 300 CPU cells, a CPU cell for each board wire being tested.

The data captured for each of the CPU cells in the chain are shifted through the chain. The last CPU cell in the chain outputs the captured data to circuitry 201 that performs analysis on the data in order to determine if any of the interconnects associated with the CPU cells are faulty due to defects. The defect may be an open or a short. In one embodiment, such a defect can be identified because a solder defect (open or shorts) at the pad changes the expected line voltage level, which allows a defect to be captured. In one embodiment, various algorithms are used to find shorts or opens on any given line, and its impact of neighboring lines using this infrastructure.

In one embodiment of the platform testing, the cells that are adjacent to a particular cell can influence the results of the testing for that cell. In FIG. 2, for example, cells N+1 and N−1 can influence the results of the testing of cell N. Therefore, during testing, data is captured by both the comparator and the ADC of all the cells and is shifted out as part of a chain. The chain shifting and processing circuitry 201 receives the data that is shifted out of the CPU cells and includes analysis circuitry to detect if the connection for a particular cell between the pads is good or bad based on data it captured, as well as data captured by its neighboring cells.

In one embodiment, this analysis is done by comparing the expected value with the value that is actually received. In one embodiment, the analysis circuitry uses firmware and/or software to perform one or more functions.

Figure 3:
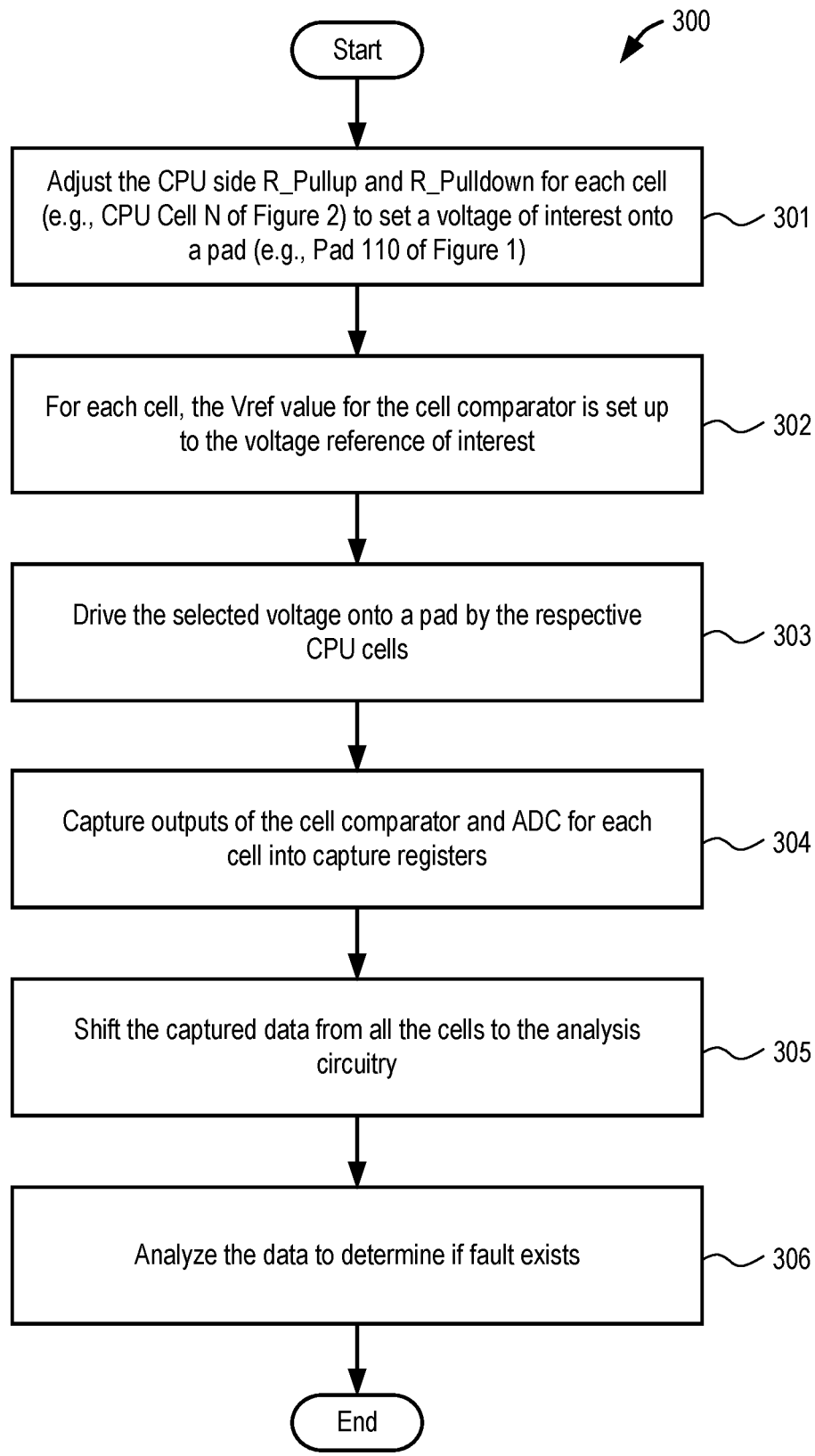
FIG. 3 is a flow diagram of one embodiment of a process for testing connections on a platform.

FIG. 3 is a flow diagram of one embodiment of a process for testing connections on a platform. Referring to FIG. 3, the process begins by adjusting the CPU side R_pullup and R_pulldn resistances for each cell (e.g., CPU cell N of FIG. 2) to set a voltage of interest onto a pad (e.g., pad 110 of FIG. 1) (processing block 301). In one embodiment, a voltage divider network working on the shifted vectors ensures this. That is, the R_pullup and R_pulldn are a resistor network, and one can program (aka choose) how many sub-resistors are active in R_pullup and R_pulldn network. This is how to achieve the desired voltage levels. In one embodiment, the R_pullup and R_pulldn resistances for each driver in the platform being tested are set by executing an instruction that causes register values for each to be programmed to specific values. In one embodiment, the chain shifting and processing circuitry 201 of FIG. 2 accesses and programs these driver settings.

Next, for each cell, the Vref value for the cell comparator is set up to the voltage reference of interest depending on whether a one or a zero is to be detected at the driver output (based on the pull up and pull down resistance values that have been set for the driver). In one embodiment, the Vref is an analog voltage set based on the DDR technology that is being tested. In one embodiment, the value is programmable through control registers. If the Vref is set to be greater than the voltage level output from the cell driver that is received on Vin input of the cell comparator, then the expected captured value is to be a 0. If the Vref is set to be less than the voltage level output from the cell driver that is received on Vin input of the cell comparator, then the expected captured value is to be a 1. For example, if using a 0.7 voltage to be detected as a 1, the pull up and pull downs are adjusted to get a value of 0.7 volts to be driven onto the pad and Vref may be set to be 0.5 such that if the results of the comparison indicates the value is greater than 0.5, the voltage values detected would be considered a 1.

Note that the description herein discusses driving of a voltage of one or zero onto the pad. However, the techniques described here are not limited to driving a zero or a one, it may be applicable to driving other voltages such as 1.1 volts, 2.5 volts or other voltages for which a voltage reference could be set up and used to compare the voltages being driven on a particular pad.

In one embodiment, when turning the Vref to a desired value, the A/D output is compared to the expected digital value and the Vref settings are adjusted to be able to accurately tune the Vref to enable the incoming value to be determined as a one or zero.

After the R_pullup and R_pulldn resistances for each driver and the Vref for each cell are adjusted, the selected voltage is driven onto a pad by the respective CPU cells (processing block 303). The outputs of the comparator and ADC for each cell are captured into capture registers (processing block 304) and the captured data is shifted from all the cells to the analysis circuitry (processing block 305). In one embodiment, in addition to the outputs of the comparator and the ADC, the code associated with programming the pullup and pulldown resistors is also shifted with the chain shifting and processing circuitry. This data indicates whether a particular driver register has been turned off or on in the neighboring cells. Therefore, the cells with drivers that are not driving a particular pad during a particular time in the platform testing is also identified in the shift chain and shifted into the chain shifting and processing circuitry.

Once the data has been received by the analysis circuitry, the data is analyzed to determine if a fault exists (processing block 306). In one embodiment, the determination detects opens and shorts. In one embodiment, an algorithm is used in connection with the logic table to detect various faults based in the values that are captured and shifted to the analysis circuitry.

After the data has been shifted in, the processing circuitry can determine whether faults associated with the platform exist. In one embodiment, the table set forth below is used to determine whether there are faults.

TABLE 1

Identifying Platform Defects

| Cell N | Neighboring Cells (N − 1), (N + 1) | Data read from the cell N | Diagnosis |
|---|---|---|---|
| 1 | 1 | 1 | Passing |
| 1 | 1 | 0 | Open on the board; or short to a ground |
| 1 | 0 | 1 | Passing |
| 1 | 0 | 0 | Short to neighboring cell |
| 0 | 1 | 0 | Passing |
| 0 | 1 | 1 | Impact of cross talk from the neighboring cell |
| 0 | 0 | 1 | Short to VCC on the board |

Column 1: Data that is placed (written) on cell N for platform testing.

Column 2: Data that is placed (written) on cells N+1, N−1 for platform testing.

Column 3: Data read from cell N. If this data differs from the column 1 data i.e. data that is written, then there is an issue, i.e. impact on cell N due to cells N−1 and N+1

Referring to Table 1, if the driver of cell N is programmed to drive a digital 1 onto the pad, both the neighboring cells, cells N−1 and N+1, are programmed to also drive a digital one onto their pads, and the resulting value that is read by cell N is a 1, then the connection between cell N and the DRAM passes testing. However, if in the same situation, the data read from cell N is a 0, then there are either two potential problems associated with the connection. In this case, there is either an open on the board or short to ground.

If the driver of cell N is programmed to drive a digital 1 and the neighboring cells N−1 and N+1 are programmed to drive a 0, and the resulting value that is read by cell N is a 1, then the platform connection between cell N and the DRAM passes testing. However, in this case, if a 0 is read by cell N, then there is a short to a neighboring cell.

If the cell N is programmed to drive a digital 0 onto the pad, both neighboring cells N−1 and N+1 are programmed to drive a digital 1 onto their respective pads, and the data that is read by cell N is a 0, then the connection between cell N and DRAM passes the test. However, if the data read by cell N in such a situation is a 1, then there is cross talk from a neighboring cell.

Lastly, if the driver of cell N is programmed to produce a digital 0 onto the pad, both the neighboring cells N−1 and N+1 are programmed in the same manner to drive a digital 0 onto the pad, and the data read by cell N is a digital 1, then there is a short to VCC on the board.

For the first cell in the shift chain, only cell N+1 is taken into account, and for the last cell, only cell N−1 is taken into account because the missing cells are assumed not to harm cell N.

This process of FIG. 3 is repeated for all the cells so that a determination can be made for each cell as to whether its connection to the DRAM is free of faults.

Note while the platform testing above is directed to testing of connections to DRAM, the techniques are not limited to connections to DRAM and may be used to test other types of interconnects.

Clock Control During Platform Testing

In one embodiment, the integrated circuit (e.g., SoC) that is connected to and performing the platform testing undergoes reset according to a reset sequence that has five main phases. A brief description of the activities in these phases is as follows:

1) Phase 0: Power rails ramp up.
2) Phase 1: Various power-good signals are asserted indicating that the power rails are stable and units are safe to start un-gating process.
3) Phase 2: System agent (SA, mainly uncore (or not part of the core)) and the ring (logic that connects the CPU and graphics to SA) is out of reset. All phased lock loops (PLLs) (clock generators) are locked. Most of the fuses are downloaded and distributed.
4) Phase 3: The micro code that controls the CPU initializes and brings the CPU out of reset.
5) Phase 4: The memory controller is out of reset and the Basic Input Output System (BIOS) initialization begins.

Figure 4:
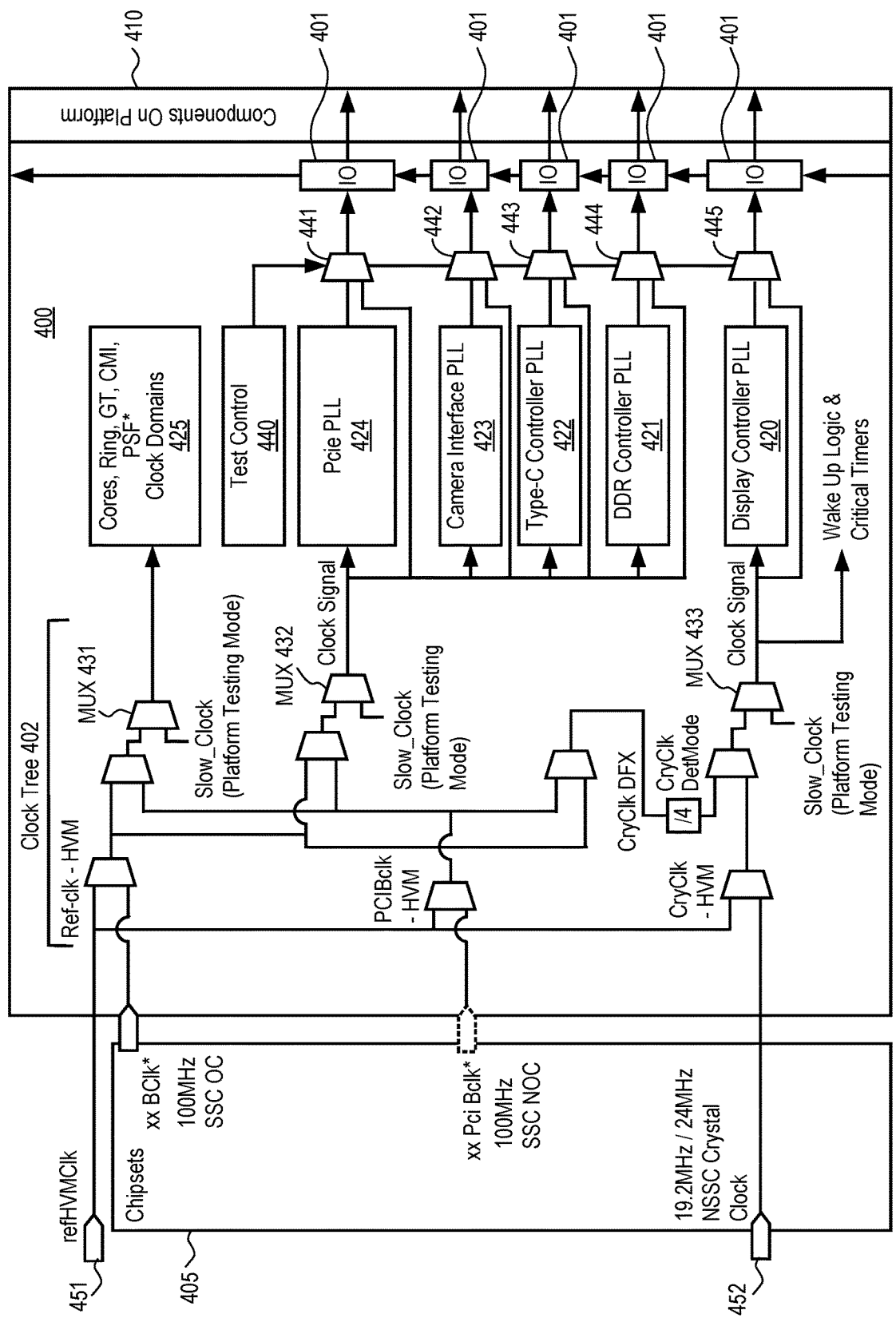
FIG. 4 illustrates one embodiment of circuitry illustrating a clocking layout for use during platform testing and regular operation.

One problem is that during platform testing, the reference clocks are stopped and therefore the PLLs (clock generators) that provide clocking to blocks is not operational. In this case, the IO blocks will not be functional initially when reset occurs as they receive a clock from the PLL. As set forth above, PLLs won't lock before phase 2 of the reset sequence. However, several debug testing scenarios require platform testing to start much sooner and the components that are being tested need clocks. FIG. 4 illustrates one embodiment of circuitry to allow the testing to start sooner. This is accomplished by preventing the firmware from shutting down the Inputs/Outputs (IOs) for power saving, since board testing requires all components to be powered. In one embodiment, this circuitry prevents the firmware from shutting down the IO components like CSI (Camera Serial Interface), Display, DDR et al., during the reset sequence. In one embodiment, hooks are used to create a different execution branch to the power-management firmware. In the board testing mode, capabilities are included in the power management block to override reset signals and power-wakeup signals for several of the intellectual property (IP) blocks, thereby obviating the need for a complete reset sequence. Also, PLLs are bypassed and an externally provided clock (e.g., ring-oscillator clock) are used instead to make the IO blocks operational during testing, without the need for reset sequence completion to enable platform testing. In one embodiment, a separate clock signal pin to the SOC is provided that is independent of the functional clock. In one embodiment, the new clock is interleaved into the existing clock tree to reduce overload of providing additional routing required across the chip. Also this reduces the design convergence effort.

Thus, the circuitry prevent firmware from shutting down the IOs for power saving, since board testing requires all components to be powered.

In one embodiment, the power management block is forced to override the power good signals and reset signals going to various functional blocks. In addition, an alternative clocking mechanism is used to run the IOs.

FIG. 4 illustrates one embodiment of external clocks to bypass internal clock generators (e.g., PLLs) to enable board testing. In one embodiment, the clock bypass is part of an integrated circuit (IC) 400, such as a SoC or a processor. The techniques disclosed herein are not limited to a SoC or a processor and may be incorporated into any IC having IOs that need to receive clocking during platform testing. IC 400 is coupled to a chipset 405 and a platform 410. In one embodiment, chipset 405 is part of IC 400.

Referring to FIG. 4, there are a number of components or processing elements in IC 400 that interface to platform 410 via IO interfaces 401. IO interfaces may be unidirectional such as in the case of a display or bidirectional. Each of IO interfaces 401 is coupled to a controller that controls IO interface 401 and allows it to communicate data to and/or from platform 410. That is, each of IO interfaces 401 has a controller that controls its activity such that if data needs to be driven it is processed and sent to the IO interface 401 by the controller. For example, display controller 420 provides the display data to its IO interface 401. Similarly, DDR controller 421, Type-C controller 422, camera interface 423, and PCI interface controller 424 also interface to platform 410 with IO interfaces 401.

In one embodiment, IC 400 includes another set of components with their own clock domains. In one embodiment, these components include processor cores, a ring interconnect, graphics technology (GT) (e.g., a graphics engine), cache mirroring interface (CMI), and a primary scalable fabric (PSF) (e.g., a high speed network that facilitates communication between various components).

In one embodiment, IC 400 includes a clock tree 402 that generates clock signals for IO interfaces 401, their controllers and other clock domains (e.g., 425). Clock tree 402 provides clock signals from one or more clock generators, which are used to clock each of IO interfaces 401 when not in test mode. In one embodiment, the clock generators comprise a phased lock loop (PLL), which are not shown. The PLL receives an external reference clock and generates clock signals based on the reference clock signal. More specifically, the PLL uses the clock ratio and locks onto reference clock to produce the clock signal that is output to IO interfaces 401 as well as their controllers (e.g., display controller 420, DDR controller 421, Type-C controller 422, camera interface 423, and PCI interface controller 424, etc.).

In one embodiment, during test mode, IO interfaces 401 are clocked from clock signal that is received from a separate external clock pin. This clock pin bypasses the PLL portion of the clock tree during platform testing and acts as a bypass mechanism to allow the external clock to clock the corresponding IO blocks during platform testing. This clock does not need to be locked by a PLL and does not have the external burden of routing the clock separately to different places. In one embodiment, this clock has a number of advantages, because the clock used during testing does not have to be as stable as the regular clock it can be implemented with a much cheaper and less expensive clock. Furthermore, during the reset sequence, the PLL locks the clock only in phase 2. Therefore, the testing of the IO blocks could not occur until after the PLL obtain lock in phase 2. However, by clocking IO interfaces 401 with the external clock (that doesn't require a PLL lock) during platform testing, the testing of the IO circuitry may occur immediately, which saves time in the testing process. Thus, in one embodiment, a separate pin with a cheaper clock is provided that does not require PLL lock and is used to clock the ports during port/IO testing.

The external clock is provided as an input to each of multiplexors (muxes) 431-433. Based on the selection inputs of muxes 431-433, the clock from the external pin can be provided during platform testing mode or the regular PLL-based clock can be provided during regular (non-testing mode) operation of IC 400. Muxes 441-445 allow the clock to be provided to IO interfaces 401. Therefore, when muxes 431-433 output the clock signal used during platform testing, IO interfaces receive that clock from muxes 441-445. This is controlled by test control 440.

Note that a reference clock 451 and a crystal clock 452 are also input into the clock tree. Both these clocks go to PLLs as reference clocks.

Figure 5:
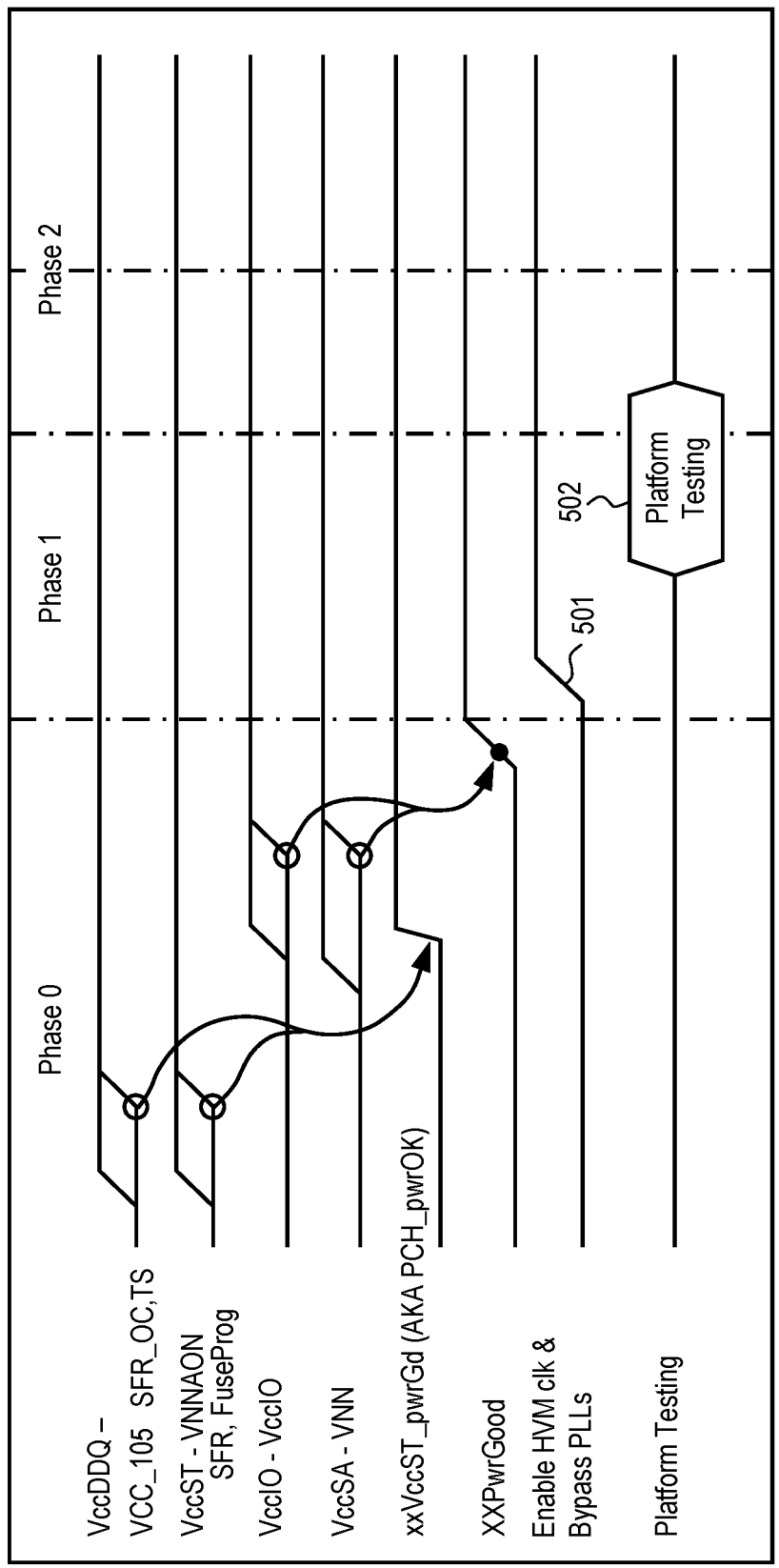
FIG. 5 is a timing diagram that shows one embodiment of the reset and platform testing initiation operation.

FIG. 5 is a timing diagram that shows one embodiment of the reset and platform testing initiation operation. Referring to FIG. 5, the HVM clock is enabled and the PLLs bypassed early in Phase 1 (501). This allows platform testing to being in Phase 1 (502), much early than Phase 2, which is what was done previously.

Figure 6:
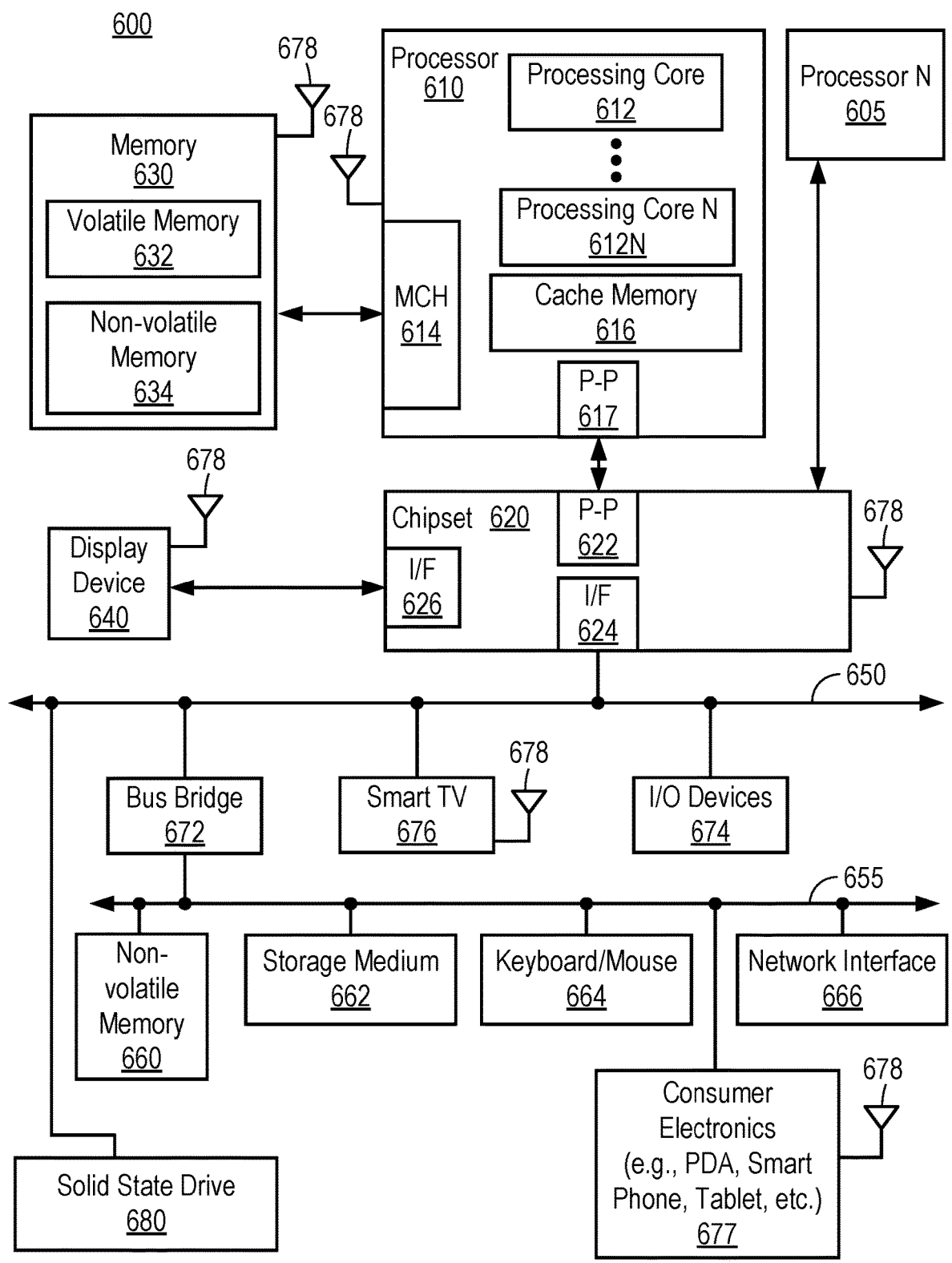
FIG. 6 is a block diagram of one embodiment of a system.

FIG. 6 is one embodiment of a system level diagram 600 that may incorporate the techniques described above. For example, the techniques described above may be incorporated into an interconnect or interface in system 600.

Referring to FIG. 6, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, system 600 implements the methods disclosed herein and may be a system on a chip (SOC) system.

In one embodiment, processor 610 (e.g., processing device 101 of FIG. 1) has one or more processor cores 612 to 612N, where 612N represents the Nth processor core inside the processor 610 where N is a positive integer. In one embodiment, system 600 includes multiple processors including processors 610 and 605, where processor 605 has logic similar or identical to logic of processor 610. In one embodiment, system 600 includes multiple processors including processors 610 and 605 such that processor 605 has logic that is completely independent from the logic of processor 610. In such an embodiment, a multi-package system 600 is a heterogeneous multi-package system because the processors 605 and 610 have different logic units. In one embodiment, processing core 612 includes, but is not limited to, pre-fetch logic to fetch instructions, decode logic to decode the instructions, execution logic to execute instructions and the like. In one embodiment, processor 610 has a cache memory 616 to cache instructions and/or data of the system 600. In another embodiment of the invention, cache memory 616 includes level one, level two and level three, cache memory, or any other configuration of the cache memory within processor 610.

In one embodiment, processor 610 includes a memory control hub (MCH) 614, which is operable to perform functions that enable processor 610 to access and communicate with a memory 630 that includes a volatile memory 632 and/or a non-volatile memory 634. In one embodiment, memory control hub (MCH) 614 is positioned outside of processor 610 as an independent integrated circuit.

In one embodiment, processor 610 is operable to communicate with memory 630 and a chipset 620. In such an embodiment, SSD 680 executes the computer-executable instructions when SSD 680 is powered up.

In one embodiment, processor 610 is also coupled to a wireless antenna 678 to communicate with any device configured to transmit and/or receive wireless signals. In one embodiment, wireless antenna interface 678 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory (e.g., NAND, NOR), phase change memory (PCM), read-only memory (ROM), electrically erasable programmable read-only memory (EEPROM), or any other type of non-volatile memory device.

Memory 630 stores information and instructions to be executed by processor 610. In one embodiment, chipset 620 connects with processor 610 via Point-to-Point (PtP or P-P) interfaces 617 and 622. In one embodiment, chipset 620 enables processor 610 to connect to other modules in the system 600. In one embodiment, interfaces 617 and 622 operate in accordance with a PtP communication protocol such as the Intel QuickPath Interconnect (QPI) or the like.

In one embodiment, chipset 620 is operable to communicate with processor 610, 605, display device 640, and other devices 672, 676, 674, 660, 662, 664, 666, 677, etc. In one embodiment, chipset 620 is also coupled to a wireless antenna 678 to communicate with any device configured to transmit and/or receive wireless signals.

In one embodiment, chip set 620 connects to a display device 640 via an interface 626. In one embodiment, display device 640 includes, but is not limited to, liquid crystal display (LCD), plasma, cathode ray tube (CRT) display, or any other form of visual display device. In addition, chipset 620 connects to one or more buses 650 and 655 that interconnect various modules 674, 660, 662, 664, and 666. In one embodiment, buses 650 and 655 may be interconnected together via a bus bridge 672 if there is a mismatch in bus speed or communication protocol. In one embodiment, chipset 620 couples with, but is not limited to, a non-volatile memory 660, a mass storage device(s) 662, a keyboard/mouse 664, and a network interface 666 via interface 624, smart TV 676, consumer electronics 677, etc.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface.

While the modules shown in FIG. 6 are depicted as separate blocks within the system 600, the functions performed by some of these blocks may be integrated within a single semiconductor circuit or may be implemented using two or more separate integrated circuits.

The disclosure sets forth a number of example embodiments, including, but not limited to the example embodiments below.

Example 1 is an integrated circuit comprising: a plurality of interface circuitries, wherein each interface circuitry comprises a driver with adjustable pullup and pulldown resistances and having a driver output to output a driver voltage during test mode, and a comparator having a first input coupled to the driver output and a second input coupled to a voltage reference, the comparator being operable to generate a comparator output in response to comparing the driver voltage with the voltage reference; and analysis circuitry coupled to receive the comparator output, the analysis circuitry operable, during the test mode, to detect existence of a fault associated with a signal path coupled to a pad for each interface circuitry.

Example 2 is the integrated circuit of example 1 that optionally includes a pullup and pulldown resistance controller operable to generate control signals to adjust the pullup and pulldown resistances.

Example 3 is the integrated circuit of example 1 that optionally includes a first memory element to capture the comparator output, and wherein the first memory element is part of a shift chain.

Example 4 is the integrated circuit of example 3 that optionally includes that the plurality of interface circuitries are coupled together as part of the shift chain, and further comprising chain shifting circuitry coupled to provide an input to the shift chain and coupled to receive an output of the shift chain and to provide comparator outputs from the plurality of interface circuitries to the analysis circuitry.

Example 5 is the integrated circuit of example 4 that optionally includes that the analysis circuitry is operable to detect existence of a fault associated with a signal path coupled to the pad for each interface circuitry based on the comparator output of said each interface circuitry and interface circuitries adjacent to said each interface circuitry.

Example 6 is the integrated circuit of example 5 that optionally includes a pullup and pulldown resistance controller operable to generate control signals to adjust the pullup and pulldown resistances based on values programmed into registers, and wherein the values are sent to the pullup and pulldown resistance controller via the shift chain.

Example 7 is the integrated circuit of example 5 that optionally includes that each interface circuitry further comprises an analog-to-digital converter (ADC) coupled to the driver output and having an ADC output to send a digital representation of the driver voltage.

Example 8 is the integrated circuit of example 1 that optionally includes a clock tree to provide one or more clock signals to each interface circuitry of the plurality of interface circuitries, the clock tree having one or more bypass paths; and a clock signal pin coupled to the one or more bypass paths to provide clock signals to the plurality of interface circuitries during the test mode in response to an external clock signal received on the clock signal pin.

Example 9 is a system comprising: a circuit board; a memory coupled to the circuit board; an integrated circuit coupled to the memory via the circuit board using a plurality of interface circuitries, wherein each interface circuitry comprises a driver with adjustable pullup and pulldown resistances and having a driver output to output a driver voltage to a pad during test mode, and a comparator having a first input coupled to the driver output and a second input coupled to a voltage reference, the comparator being operable to generate a comparator output in response to comparing the driver voltage with the voltage reference; and analysis circuitry coupled to receive the comparator output, the analysis circuitry operable, during the test mode, to detect existence of a fault associated with a signal path coupled between the pad for each interface circuitry and a memory pad for the memory.

Example 10 is the integrated circuit of example 9 that optionally includes that the IC further comprises a pullup and pulldown resistance controller operable to generate control signals to adjust the pullup and pulldown resistances.

Example 11 is the integrated circuit of example 9 that optionally includes that the IC further comprises a first memory element to capture the comparator output, and wherein the first memory element is part of a shift chain.

Example 12 is the integrated circuit of example 11 that optionally includes that the plurality of interface circuitries are coupled together as part of the shift chain, and further comprising chain shifting circuitry coupled to provide an input to the shift chain and coupled to receive an output of the shift chain and to provide comparator outputs from the plurality of interface circuitries to the analysis circuitry.

Example 13 is the integrated circuit of example 12 that optionally includes the analysis circuitry is operable to detect existence of a fault associated with a signal path coupled to the pad for each interface circuitry based on the comparator output of said each interface circuitry and interface circuitries adjacent to said each interface circuitry.

Example 14 is the integrated circuit of example 13 that optionally includes that the IC further comprises a pullup and pulldown resistance controller operable to generate control signals to adjust the pullup and pulldown resistances based on values programmed into registers, and wherein the values are sent to the pullup and pulldown resistance controller via the shift chain.

Example 15 is the integrated circuit of example 9 that optionally includes an analog-to-digital converter (ADC) coupled to the driver output and having an ADC output to send a digital representation of the driver voltage, wherein the ADC output is sent to the analysis circuitry via a shift chain.

Example 16 is the integrated circuit of example 9 that optionally includes that the IC further comprises: a clock tree to provide one or more clock signals to each interface circuitry of the plurality of interface circuitries, the clock tree having one or more bypass paths; and a clock signal pin coupled to the one or more bypass paths to provide clock signals to the plurality of interface circuitries during the test mode in response to an external clock signal received on the clock signal pin.

Example 17 is machine-readable medium having stored thereon an instruction, which if performed by a machine causes the machine to perform a method comprising: for a plurality of interface circuitries, adjusting pullup and pulldown resistances of a driver to cause a driver output of the driver to output a driver voltage to a pad during a test mode, and generating and capturing a comparator output in response to comparing the driver voltage with the voltage reference; and performing analysis on the comparator outputs of the plurality of interface circuitries, during the test mode, to detect whether a fault associated with a signal path coupled to the pad for each interface circuitry exists based on the comparator output of said each interface circuitry and interface circuitries adjacent to said each interface circuitry.

Example 18 is the integrated circuit of example 17 that optionally includes that the method further comprises executing one or more instructions to generate control signals to adjust the pullup and pulldown resistances.

Example 19 is the integrated circuit of example 17 that optionally includes that the plurality of interface circuitries are coupled together as part of the shift chain, and the method further comprises shifting comparator outputs for the plurality of interface circuitries to analysis circuitry performing the analysis on the comparator outputs using the shift chain.

Example 20 is the integrated circuit of example 19 that optionally includes that the method further comprises shifting values to a controller using the shift chain to enable the controller to generate the control signals to adjust the pullup and pulldown resistances for the driver.

Example 21 is a processor or other apparatus that includes means for performing the method of any one of examples 17 to 20.

Example 22 is a processor or other apparatus substantially as described herein.

Example 23 is a processor or other apparatus that is operative to perform any method substantially as described herein.

Example 24 is a processor or other apparatus that is operative to perform any instructions/operations substantially as described herein.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An integrated circuit comprising:
   a plurality of interface circuitries, wherein each interface circuitry comprises
      a driver with adjustable pullup and pulldown resistances and having a driver output to output a driver voltage during test mode, and
      a comparator having a first input coupled to the driver output and a second input coupled to a voltage reference, the comparator being operable to generate a comparator output in response to comparing the driver voltage with the voltage reference; and
   analysis circuitry coupled to receive the comparator output, the analysis circuitry operable, during the test mode, to detect existence of a fault associated with a signal path coupled to a pad for each interface circuitry.

2. The IC defined in claim 1 further comprising a pullup and pulldown resistance controller operable to generate control signals to adjust the pullup and pulldown resistances.

3. The IC defined in claim 1 further comprising a first memory element to capture the comparator output, and wherein the first memory element is part of a shift chain.

4. The IC defined in claim 3 wherein the plurality of interface circuitries are coupled together as part of the shift chain, and further comprising chain shifting circuitry coupled to provide an input to the shift chain and coupled to receive an output of the shift chain and to provide comparator outputs from the plurality of interface circuitries to the analysis circuitry.

5. The IC defined in claim 4 wherein the analysis circuitry is operable to detect existence of a fault associated with a signal path coupled to the pad for each interface circuitry based on the comparator output of said each interface circuitry and interface circuitries adjacent to said each interface circuitry.

6. The IC defined in claim 4 further comprising a pullup and pulldown resistance controller operable to generate control signals to adjust the pullup and pulldown resistances based on values programmed into registers, and wherein the values are sent to the pullup and pulldown resistance controller via the shift chain.

7. The IC defined in claim 1 wherein said each interface circuitry further comprises an analog-to-digital converter (ADC) coupled to the driver output and having an ADC output to send a digital representation of the driver voltage.

8. The IC defined in claim 1 further comprising:
a clock tree to provide one or more clock signals to each interface circuitry of the plurality of interface circuitries, the clock tree having one or more bypass paths; and
a clock signal pin coupled to the one or more bypass paths to provide clock signals to the plurality of interface circuitries during the test mode in response to an external clock signal received on the clock signal pin.

9. A system comprising:
a circuit board;
a memory coupled to the circuit board;
an integrated circuit coupled to the memory via the circuit board using a plurality of interface circuitries, wherein each interface circuitry comprises
a driver with adjustable pullup and pulldown resistances and having a driver output to output a driver voltage to a pad during test mode, and
a comparator having a first input coupled to the driver output and a second input coupled to a voltage reference, the comparator being operable to generate a comparator output in response to comparing the driver voltage with the voltage reference; and
analysis circuitry coupled to receive the comparator output, the analysis circuitry operable, during the test mode, to detect existence of a fault associated with a signal path coupled between the pad for each interface circuitry and a memory pad for the memory.

10. The system defined in claim 9 wherein the IC further comprises a pullup and pulldown resistance controller operable to generate control signals to adjust the pullup and pulldown resistances.

11. The system defined in claim 9 wherein the IC further comprises a first memory element to capture the comparator output, and wherein the first memory element is part of a shift chain.

12. The system defined in claim 11 wherein the plurality of interface circuitries are coupled together as part of the shift chain, and further comprising chain shifting circuitry coupled to provide an input to the shift chain and coupled to receive an output of the shift chain and to provide comparator outputs from the plurality of interface circuitries to the analysis circuitry.

13. The system defined in claim 12 wherein the analysis circuitry is operable to detect existence of a fault associated with a signal path coupled to the pad for each interface circuitry based on the comparator output of said each interface circuitry and interface circuitries adjacent to said each interface circuitry.

14. The system defined in claim 13 wherein the IC further comprises a pullup and pulldown resistance controller operable to generate control signals to adjust the pullup and pulldown resistances based on values programmed into registers, and wherein the values are sent to the pullup and pulldown resistance controller via the shift chain.

15. The system defined in claim 9 further comprising an analog-to-digital converter (ADC) coupled to the driver output and having an ADC output to send a digital representation of the driver voltage, wherein the ADC output is sent to the analysis circuitry via a shift chain.

16. The system defined in claim 9 wherein the IC further comprises:
a clock tree to provide one or more clock signals to each interface circuitry of the plurality of interface circuitries, the clock tree having one or more bypass paths; and
a clock signal pin coupled to the one or more bypass paths to provide clock signals to the plurality of interface circuitries during the test mode in response to an external clock signal received on the clock signal pin.

17. A machine-readable medium having stored thereon an instruction, which if performed by a machine causes the machine to perform a method comprising:
for a plurality of interface circuitries,
adjusting pullup and pulldown resistances of a driver to cause a driver output of the driver to output a driver voltage to a pad during a test mode, and
generating and capturing a comparator output in response to comparing the driver voltage with the voltage reference; and
performing analysis on the comparator outputs of the plurality of interface circuitries, during the test mode, to detect whether a fault associated with a signal path coupled to the pad for each interface circuitry exists based on the comparator output of said each interface circuitry and interface circuitries adjacent to said each interface circuitry.

18. The machine-readable medium defined in claim 17 wherein the method further comprises executing one or more instructions to generate control signals to adjust the pullup and pulldown resistances.

19. The machine-readable medium defined in claim 17 wherein the plurality of interface circuitries are coupled together as part of the shift chain, and the method further comprises shifting comparator outputs for the plurality of interface circuitries to analysis circuitry performing the analysis on the comparator outputs using the shift chain.

20. The machine-readable medium defined in claim 19 wherein the method further comprises shifting values to a controller using the shift chain to enable the controller to generate the control signals to adjust the pullup and pulldown resistances for the driver.

* * * * *